United States Patent [19]

Wong

[11] 4,272,811
[45] Jun. 9, 1981

[54] WRITE AND READ CONTROL CIRCUIT FOR SEMICONDUCTOR MEMORIES

[75] Inventor: Thomas S. Wong, San Jose, Calif.

[73] Assignee: Advanced Micro Devices, Inc., Sunnyvale, Calif.

[21] Appl. No.: 84,943

[22] Filed: Oct. 15, 1979

[51] Int. Cl.³ .............................................. G11C 7/00
[52] U.S. Cl. ................................... 365/190; 365/155
[58] Field of Search ....................... 365/154, 155, 190

[56] References Cited

U.S. PATENT DOCUMENTS

| | | | |
|---|---|---|---|
| 3,725,878 | 4/1973 | Berding | 365/155 |
| 4,099,070 | 7/1978 | Reinert | 365/155 |

Primary Examiner—Stuart N. Hecker
Attorney, Agent, or Firm—J. Ronald Richbourg

[57] ABSTRACT

A new and improved write and read control circuit for semiconductor memories is provided that comprises a first pair of transistors having their emitter terminals coupled to a current source, a base terminal of a first of the first pair being disposed for receiving data to be written in the array and a base terminal of a second of the first pair being coupled to a first reference potential, and each of the first pair of transistors having collector terminals; a second pair of transistors having their collector terminals coupled to a second reference potential, the base terminal of a first of the second pair being coupled to the collector terminal of the first of the first pair of transistors and the base terminal of a second of the second pair being coupled to the collector terminal of a second of the first pair, the emitter terminal of the first of the second pair being coupled to a second current source and forming a first output of the circuit, and the emitter terminal of the second of the second pair being coupled to a third current source and forming a second output of the circuit.

10 Claims, 6 Drawing Figures

WRITE AND READ CONTROL CIRCUIT FOR SEMICONDUCTOR MEMORIES

BACKGROUND OF THE INVENTION

1. Field of the Invention

This invention relates to semiconductor memory devices, and more particularly to a new and improved read/write control circuit for such a memory device.

2. Prior Art

With the rapid improvements in semiconductor technology, it is becoming more efficient and practical to integrate more and more circuitry on smaller and smaller areas of silicon. Accordingly, the area available for circuitry is becoming more valuable. Hence, more efficient circuit design is necessary to reduce the component count which also reduces the silicon area. Further, a reduction in component count in combination with improved operating speeds and lower power consumption is also the objective of efficient semiconductor circuit design.

A recent prior art read/write control circuit for a semiconductor memory is alluded to in a paper entitled "A Fast 7.5ns Access 1K-Bit RAM for Cache-Memory Systems" which appeared at page 656 of the IEEE Journal of Solid-State Circuits, Vol. SC-13, No. 5, October, 1978. Additional prior art references are shown in an IEEE Press book entitled "Semiconductor Memories", at pages 37 and 45 Edited by David A. Hodges, and another book entitled "Semiconductor Memory Design and Application" at pages 97 et seq. by G. Luecke, et al., 1973, published by the McGraw-Hill Book Company.

SUMMARY OF THE INVENTION

It is an object of this invention to provide an efficient integrated circuit design that reduces the number of circuit components, improves speed and reduces power consumption.

This invention is characterized in an array of semiconductor memory cells as a write and read control circuit that comprises a first pair of transistors having their emitter terminals coupled to a current source, a base terminal of a first of the first pair being disposed for receiving data to be written in the array and base terminal of a second of the first pair being coupled to a first reference potential, and each of the first pair of transistors having collector terminals; a second pair of transistors having their collector terminals coupled to a second reference potential, the base terminal of a first of the second pair being coupled to the collector terminal of the first of the first pair of transistors and the base terminal of a second of the second pair being coupled to the collector terminal of a second of the first pair, the emitter terminal of the first of the second pair being coupled to a second current source and forming a first output of the circuit, and the emitter terminal of the second of the second pair being coupled to a third current source and forming a second output of the circuit.

DETAILED DESCRIPTION

A plurality of asymmetrical memory cells are arranged in an array forming columns of bits and rows of words where each cell is disposed for storing and retrieving binary information. Each cell is comprised of a multivibrator circuit coupled to a pair of bit lines, which are used as a means for both writing information into and sensing information in the memory cells. Each pair of bit lines is coupled to memory cells and to the sense amplifier through a read/write control circuit.

Figure 1:
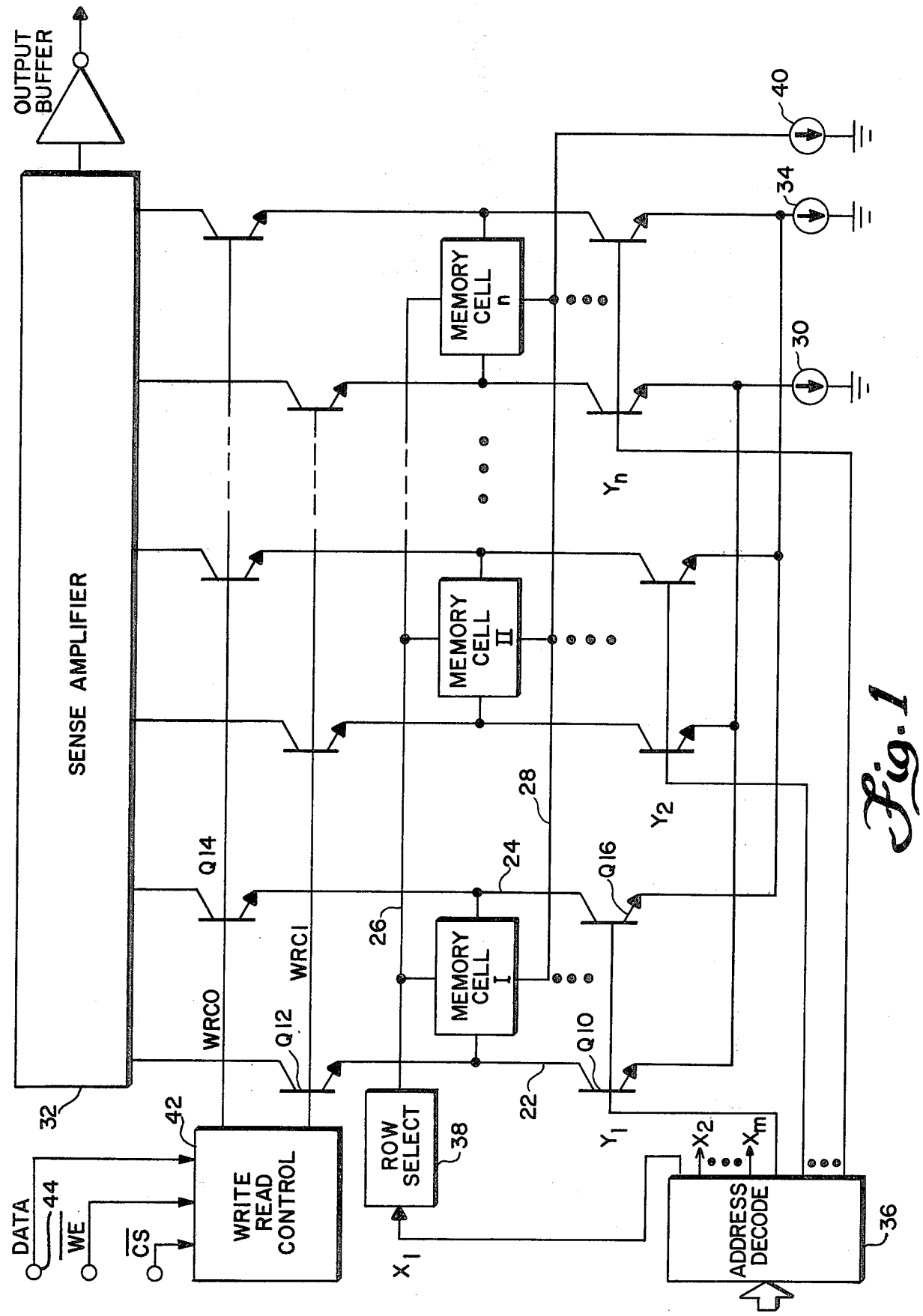
FIG. 1 is a blockschematic diagram of a memory array employing the circuit of this invention.

Referring now to FIG. 1, a block-schematic diagram is shown of a portion of memory cells I, II . . . n. The memory cell I is coupled between a pair of bit lines 22 and 24, and between a positive word line 26 and a negative word line 28. A row of memory cells are selected by the word lines 26 and 28, and a specific memory cell, such as memory cell I, is selected by activating the bit lines 22 and 24.

The bit line 22 is coupled to a current source 30 through a transistor Q10. The opposite side of the current source 30 is coupled to ground potential. Also, the bit line 22 is coupled to a sense amplifier 32 through a transistor Q12. In a similar manner, the bit line 24 is coupled to the sense amplifier 32 through a transistor Q14, and is coupled to a current source 34 through a transistor Q16. The base terminals of the transistors Q10 and Q16 are coupled to a y1 output terminal of an address decode circuit 36. Hence, the bit lines 22 and 24 are selected by the y1 signal from the address decode 36 at the base terminals of Q10 and Q16. The positive word line 26 is coupled to a row select circuit 38 having an input designated x1, which is coupled to another output terminal of the address decode circuit 36. The negative word line 28 is coupled to a current source 40. Accordingly, the row including the memory cell I is selected by activating the row select circuit 38 with the x1 output from the address decode 36.

The base terminals of the transistors Q12 and Q14 are coupled to a pair of output lines WRC1 and WRC0, respectively, from a read-write control circuit 42. Data is provided as an input to the read-write control circuit 42 on a terminal 44. The operation of the circuit 42 in combination with a memory cell will be more readily understood following a description of the schematic diagram of FIG. 2, wherein the data input terminal 44 is coupled to the base terminal of a transistor Q40. The emitter terminal of the transistor Q40 is coupled to an emitter terminal of a transistor Q42 and to the collector terminal of a transistor Q44. The emitter terminal of the transistor Q44 is coupled to a current source 60. The base terminals of the transistors Q42 and Q44 are coupled to a typical bias driver network formed of a resistor R10 and a series of diodes D10, D12, and D14. The resistor R10 is coupled between the base terminal of Q42 and the supply voltage $V_{cc}$, and the anode of the diode D10 is coupled to the base terminal of the transistor Q42. The cathode of D10 is coupled to the anode of D12, and to the base terminal of Q44. The cathode of the diode D12 is coupled to the anode of D14 and the cathode thereof is couple to ground potential.

The transistors Q40 and Q42 are coupled as a differential pair of transistors forming a differential input for the data supplied on the data input terminal 44. The collector terminal of the transistor Q40 is coupled to the base terminal of another transistor Q46 at a circuit point 62. The collector terminal of the transistor Q46 is coupled to the supply voltage $V_{cc}$ and the emitter terminal thereof is coupled to yet another current source 64. During the sense mode of operation, the potential on the base terminal of the transistor Q46 is established by a voltage divider network made up of resistors R12 and R14 in parallel with a diode D16. The resistor R12 is coupled between the circuit point 62 and $V_{cc}$, and R14 is coupled between the circuit point 62 and another circuit point 63. The diode D16 is coupled between circuit point 63 and $V_{cc}$, wherein the cathode of the diode D16 is coupled to the circuit point 63. The ratio of the values of the resistors R12 and R14 determine the sense level voltage, which will be explained further hereinbelow.

In a similar manner, the collector terminal of transistor Q42 is coupled to the base terminal of a transistor Q48 at a circuit point 66. The collector terminal of the transistor Q48 is coupled to $V_{cc}$ and the emitter terminal thereof is coupled to another current source 68. In a similar manner, the voltage at the base terminal of the transistor Q48 is established during the sense mode of operation by the voltage divider network formed of a first resistor R16 coupled between the base terminal and $V_{cc}$, and another resistor R18 coupled between the base terminal and a circuit point 67. The circuit point 67 is coupled to $V_{cc}$ through a diode D18 having the cathode terminal thereof coupled to the circuit point 67.

The circuit point 63 is coupled to the anode of a diode D20, and the cathode thereof is coupled to one side of a resistor R20. The second side of the resistor R20 is coupled to the collector terminals of two parallel-connected transistors Q50 and Q52 at a circuit point 70. In a similar manner, the circuit point 67 is coupled to the anode of a diode D22 and the cathode thereof is coupled to one side of a resistor R22. The second side of the resistor R22 is coupled to the circuit point 70. A resistor R24 is coupled between the circuit point 70 and the supply voltage $V_{cc}$. The emitter terminals of the transistors Q44, Q50 and Q52 are coupled together and this connection is coupled to the current source 60. The base terminal of the transistor Q50 is coupled to a write enable not input signal line WE, and the base terminal of the transistor Q52 is coupled to a chip select not input signal line CS. An input clamping diode D24 is coupled between the base terminals of the transistors Q40 and Q42 so as to clamp the data input signal. In a similar manner clamping diodes D26 and D28 are coupled between the base terminal of Q44 and the base terminals of Q50 and Q52, respectively.

The circuit portion enclosed within the dashed line 20 illustrates in greater detail a memory cell such as the memory cell I (FIG. 1). The emitter terminal of the transistor Q12 is coupled to a first emitter terminal of a transistor Q60 which is one of a pair of cross-coupled transistors. In a similar manner, the emitter terminal of the transistor Q14 is coupled to a first emitter terminal of the second cross-coupled transistor Q62. The second emitter terminals of the transistors Q60 and Q62 are connected together, and this connection is coupled to the negative word line 28. The base terminal of Q60 is coupled to the collector terminal of Q62, to the cathode of a diode D34 and to one side of a resistor R30. Similarly, the base terminal of Q62 is coupled to the collector terminal of Q60, to the cathode of a diode D36 and to one side of a resistor R32. The anodes of the diodes D34 and D36, and the second side of the resistors R30 and R32 are coupled together and this connection is coupled to the positive word line 26.

Figure 2:
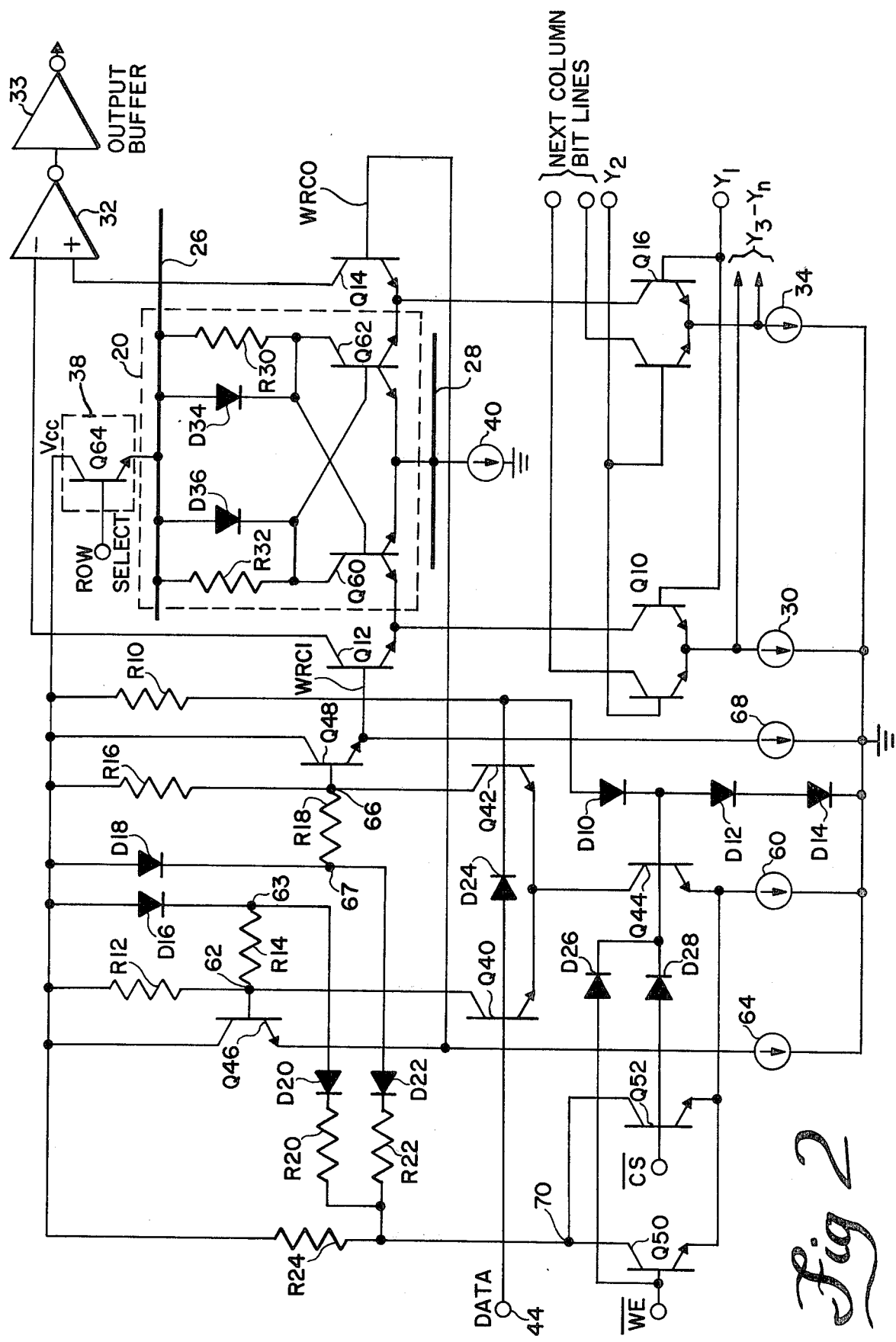
FIG. 2 is a detailed schematic diagram of the circuit of this invention as connected to at least one cell of the memory array.

The row select circuit 38 is illustrated in greater detail in FIG. 2, wherein the input terminal is coupled to the base terminal of a transistor Q64. The emitter terminal of the transistor Q64 is coupled to the positive word line 26, and the collector terminal thereof is coupled to the voltage supply $V_{cc}$. The collector terminals of the transistors Q12 and Q14 are coupled to the sense amplifier 32, and the output terminal of the sense amplifier is coupled to the input of an output buffer 33. The output of the buffer 33 constitutes the output of the memory array.

The read-write circuit 42 is in the sense mode of operation when either of the transistors Q50 and Q52 is turned ON, which couples the current source 60 to the circuit point 70. Resistors R20 and R22 are equal, hence the current to the circuit point 63 is equal to the current to the circuit point 67. The diodes D16 and D18 are in a forward polarity connection which causes a small voltage drop between the supply voltage $V_{cc}$ and the circuit points 63 and 67. In particular, the voltage drop across the diodes D16 and D18 limit the voltage drop across the resistor pairs R12-R14 and R16-R18. This voltage drop is typically 0.6 volts, and is referred to herein as $\phi$. If the resistors R12, R14, R16, and R18 are equal in value, and Q46 and Q48 are assumed to have infinite beta, then the voltage at the base terminals of Q46 and Q48 are approximately equal to $\frac{1}{2}\phi$, which is also referred to herein as the "sense level" voltage.

When the circuit is in the write mode of operation, the transistors Q50 and Q52 are OFF and the current from the source 60 is switched to the transistor Q44. This is caused by the potential on the bases of Q50 and Q52. The circuit connection of Q50, Q52, and Q44 forms a well-known ECL (emitter-coupled logic) switch. As a function of the data on the terminal 44, either Q40 or Q42 will turn ON so as to provide the proper write voltage level WRC0 or WRC1 at the emitter terminals of the transistors Q46 or Q48, respectively.

Assume, for example, that the cell is in a "one" state wherein the transistors Q10, Q12, Q16 and Q62 are ON and Q14 and Q60 are OFF. The current from the source 30 is routed through Q10 and Q12 to the sense amplifier 32, while the current from the source 34 is routed through Q16 and Q62 to the word line 26. The current from the source 40 to the second emitters of Q60 and Q62 acts to hold the cell in the written state between cell sensing operations (i.e., when the sources 30 and 34 are deactivated by the turning OFF of Q10 and Q16 or when sensing other columns of cells or when the row select signal x1 goes low.

To write a "zero" into the cell, the base of the transistor Q12 is pulled down to a level below that of the base of Q60 which will cause Q60 to turn ON and Q12 to turn OFF. The cell will thus change to the "zero" state and Q14 will also turn ON. Hence, the current from the source 34 will be routed through Q16 and Q14 to the sense amplifier 32, and the current from the source 30 will be routed through Q10 and Q60 to the word line 26.

Figure 3:
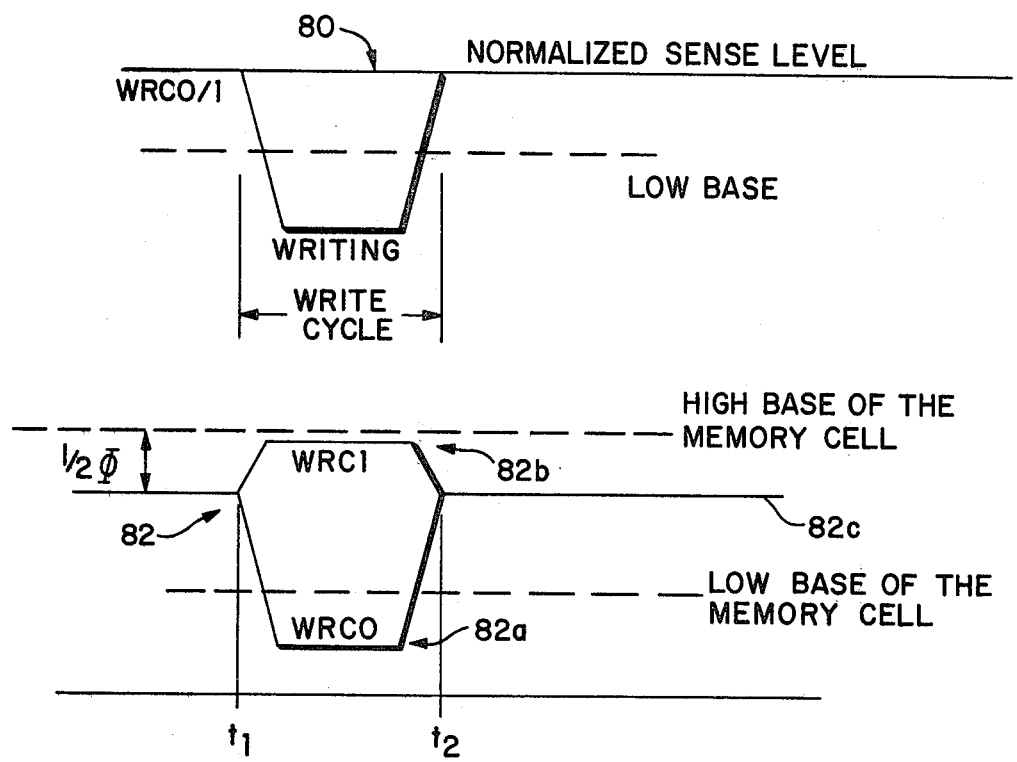
FIG. 3 is a timing diagram that illustrates a write cycle of operation of the memory array.

With reference to FIG. 3, a timing diagram of the write operation is shown wherein waveform 80 illustrates a conventional memory cell write cycle. Waveform 82 illustrates a a push-pull write cycle, wherein one side (e.g., WRC0 at level 82a) drops and the other side (e.g., WRC1 at level 82b) rises at the same time. This arrangement ensures that no bit line current can be steered into the "rise" side of the cell for a fast write operation. The level 82c is the normalized sense level, which is equal to the potential on the base terminals of Q12 and Q14 during a sense operation. A normalized sense level is a $V_{BE}$ shift below the sense level. In other words, the normalized sense level is equal to the sense level minus one $V_{BE}$.

Figure 4:
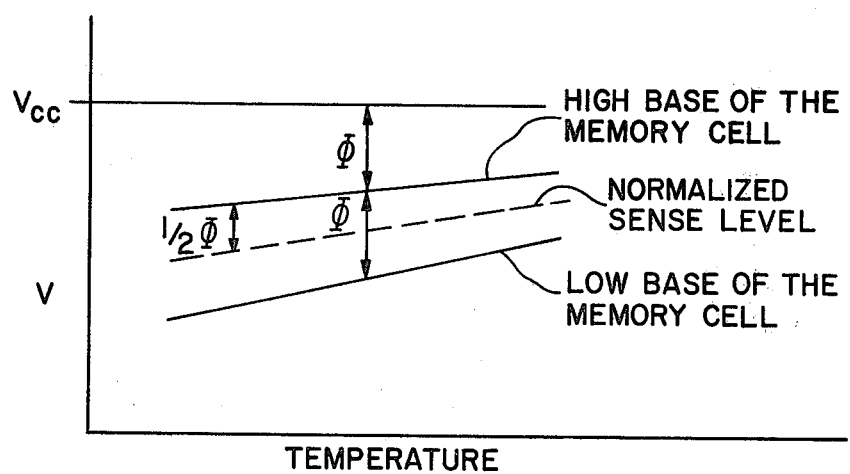
FIG. 4 is a plot of voltage versus temperature characteristic of the circuit of this invention.

FIG. 4 is a plot of the voltage for the memory cell, and the corresponding normalized sense level voltage with respect to temperature. The difference in the "high base" and the "low base" voltage levels is equal to one $V_{BE}$ or "$\phi$", wherein high base is the base voltage level of an ON transistor and low base is the base voltage level of an OFF transistor within a memory cell. The sense level voltage is located between the high and low base voltage levels. In one embodiment, the sense level was selected approximately half way between the high and low levels. This is accompanied by making the resistors R12, R14, R16 and R18 all equal to one another. Alternatively, if the sense level were established closer to the low level, the circuit response time would decrease with a sacrifice in noise immunity. If the sense level were set nearer the high level, the circuit response time would increase.

Note that both the high base and low base curves increase with an increase in temperature, but that they do not increase at the same rate. In other words, the high base and low base curves converge with an increase in temperature. More particularly, the high base curve is one $\phi$ below the $V_{cc}$ voltage drop across Q64. The low base curve is two $\phi$ below the $V_{cc}$ level as a result of not only the $V_{BE}$ across Q64 but the $V_{BE}$ across either D34 or D36 (depending upon the state of the cell). Further, as the temperature increases the $V_{BE}$ voltage drop decreases. Accordingly, as the temperature increases the high and low base voltage levels increase. The low base voltage level increases more rapidly with increasing temperature because the voltage drop is decreasing at twice the rate (two $V_{BE}$ drops). Hence, the two voltage curves converge.

As described earlier, the normalized sense level is established by the voltage divider networks at the base terminals of the transistors Q46 and Q48, which networks include the diodes D16 and D18. By forming the diodes D16 and D18 at the same time that the diodes D34 and D36 and the transistors Q46, Q48 and Q64 are formed, and all are integrated onto the same silicon chip, then their temperature characteristics are the same or substantially the same. Thus, the normalized sense level voltage will remain at substantially the same spacing between the high and low base levels over the range of temperature variations. Hence, the $V_{BE}$ voltage drop across the diodes D16 and D18 will track the $V_{BE}$ voltage drops across Q64 and D34 and D36. Accordingly, the circuit is compensated for temperature variations.

Figure 5:
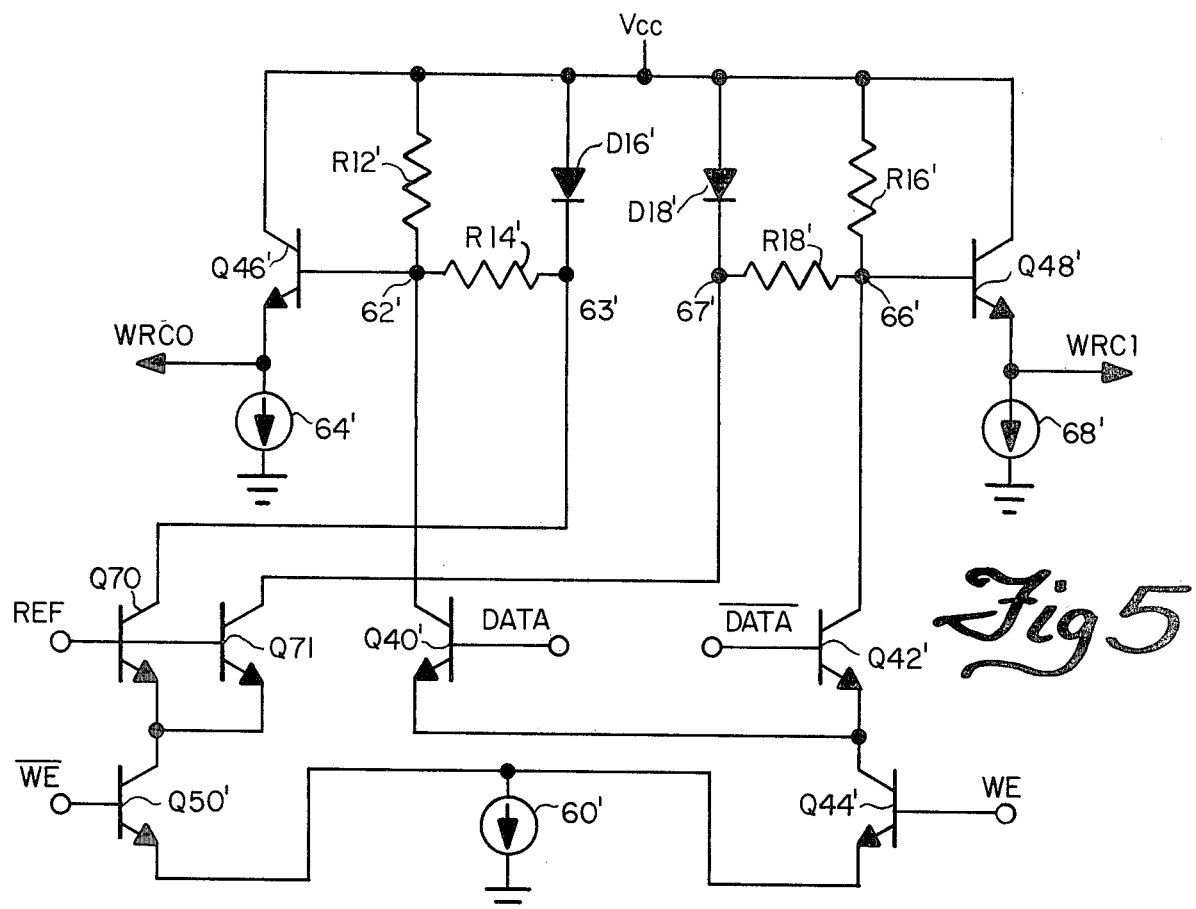
FIGS. 5 and 6 are alternate embodiments of this invention.

An alternate embodiment of the write and read control circuit of this invention is shown in FIG. 5 wherein like reference numerals and a single prime identify parts corresponding to similar parts shown in FIG. 2. More particularly, the base terminals of transistors Q40' and Q42' are coupled to a differential form of the input data referred to herein as DATA and $\overline{DATA}$, respectively. The emitter terminals of the transistors Q40' and Q42' are connected together and this connection is coupled to the collector terminal of transistor Q44'. The emitter terminal of Q44' is coupled to current source 60'. The base terminal of Q44' is coupled to the write enable signal WE. The collector terminals of the transistors Q40' and Q42' are coupled to base terminals of transistors Q46' and Q48', respectively.

The collector terminals of the transistors Q46' and Q48 are coupled to supply voltage $V_{cc}$, and the emitter terminals are coupled to current sources 64' and 68', respectively. The write and read control signals, WRC0 and WRC1, are derived at the emitter terminals of the transistors Q46' and Q48', respectively. The resistors R12', R14', R16' and R18', as well as the diodes D16' and D18', are connected together in the same manner as described above. However, the connections between the current source 60' and the circuit points 63' and 67' are different. In particular, a pair of transistors Q70 and Q71 have their base terminals connected together and this connection is disposed for connection to a source of reference potential. Also, the emitter terminals of this pair of transistors are connected together and this connection is coupled to the collector terminal of transistor Q50'. The emitter terminal of the transistor Q50' is coupled to the current source 60'. and the base terminal thereof is disposed for receiving the differential form of the write enable signal, viz.: $\overline{WE}$. The collector terminals of the transistors Q70 and Q71 are coupled to the circuit points 63' and 67'.

The main difference in operation of the circuit embodiments shown in FIG. 5 and FIG. 2 is the means by which the current from the source 60' is split and routed to the circuit points 63' and 67'. In particular, the current is split by means of the transistors Q70 and Q71. These two transistors are integrated at the same time in the same area and plane of the silicon chip, and are made identical in size and shape. Hence, the characteristics of these two transistors are the same or substantially the same, whereby their current carrying characteristics are the same or substantially the same.

The reference potential (REF) provided at the base terminals of the transistors Q70 and Q71 is preferably set at one $\phi$ (or $V_{BE}$) above the high level of the $\overline{WE}$ signal provided at the base terminal of the transistor Q50'. When the transistor Q50' is turned on, current from the source 60' is provided at the emitter terminals of Q70 and Q71, which thereby turns them on as well. Hence, the current from the source 60' is provided equally at the circuit points 63' and 67' when the $\overline{WE}$ signal goes to a high level.

An advantage of the circuit shown in FIG. 5 is that an equal amount of time delay occurs on each path from the current source 60'. In particular, transistors Q50' and Q70 or Q71 provide a two-transistor delay. Also, the transistors Q44' and Q40' or Q42' provide a two-transistor delay. In a critical timing environment this would be important.

Figure 6:
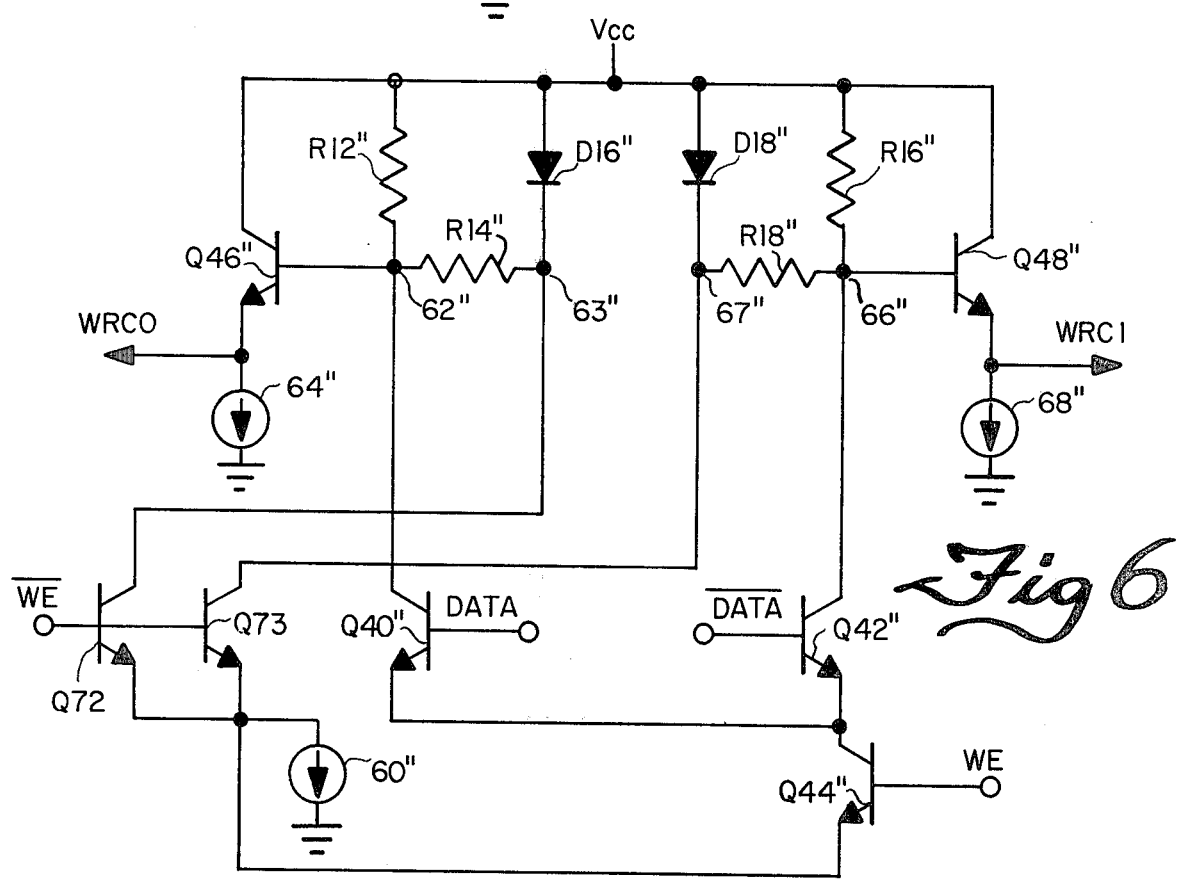

Yet another embodiment of the circuit of this invention is shown in FIG. 6 wherein like reference numerals and double prime identify parts corresponding to similar parts shown in FIG. 2. The resistors R12", R14", R16" and R18", the diodes D16" and D18", and the transistors Q46" and Q48" are all coupled in the same manner as described above with reference to both FIGS. 2 and 5. Similarly, the transistors Q40", Q42" and Q44" are coupled together in the manner as shown in FIG. 5. However, transistors Q72 and Q73 are coupled between the circuit points 63" and 67" and the current source 60". In particular, the emitter terminals of Q72 and Q73 are connected together and this connection is coupled to the current source 60". The base terminals of these transistors are connected together and this connection is disposed for receiving the write enable NOT or $\overline{WE}$ signal. The collector terminal of the transistor Q72 is coupled to the circuit point 63", and the collector terminal of the transistor Q73 is coupled to the circuit point 67".

The circuit embodiment shown in FIG. 6 is simpler in structure than those heretofore described. By applying the $\overline{WE}$ signal directly to the two identical transistors Q72 and Q73 (i.e., made identical as described above with reference to Q70 and Q71), the transistor Q50' and the REF potential are eliminated. Thus, when the transistors Q72 and Q73 are turned on by a high-level state of the WE signal, current from the source 60" is supplied to the circuit points 63" and 67". The only apparent disadvantage of this circuit embodiment is that there is no compensation for an equal time delay as described above. That is, only one transistor time delay occurs from Q70 or Q71, whereas two time delays occur in the other path as a result of the transistors Q44" and Q42". It may be appreciated from the discussion hereinabove that a memory array having a multiplicity of asymmetrical memory cells and including a new and improved read and write control circuit has been shown and described in detail. Accordingly, while the invention has been particularly shown and described with reference to a preferred embodiment, it will be understood by those skilled in the art that the foregoing and other changes in form and details may be made therein without departing from the spirit of the invention. It is therefore intended that an exclusive right be granted to my invention as limited only by the metes and bounds of the appended claims.

I claim:

1. In an array of semiconductor memory cells, a write and read control circuit comprising:
   a first pair of transistors having their emitter terminals coupled to a first current source, a base terminal of a first of said first pair being disposed for receiving data to be written in said array and a base terminal of a second of said first pair being coupled to a first reference potential, and each of said first pair of transistors having collector terminals;
   a second pair of transistors having their collector terminals coupled to a second reference potential, the base terminal of a first of said second pair being coupled to the collector terminal of the first of said first pair of transistors and the base terminal of a second of said second pair being coupled to the collector terminal of the second of said first pair, the emitter terminal of the first of said second pair being coupled to a second current source and forming a first output of said circuit, and the emitter terminal of the second of said second pair being coupled to a third current source and forming a second output of said circuit; and,
   a pair of bias voltage means coupled to the base terminals of each of said second pair of transistors.

2. A circuit as in claim 1 further characterized by each of said bias voltage means including a pair of voltage dividing resistors coupled in parallel with a shunting diode.

3. A circuit as in claim 2 further characterized by each of said cells in the array including a pair of diodes integrated substantially the same size as each of said shunting diodes such that both pairs of diodes have substantially the same temperature characteristics.

4. A circuit as in claim 2 further characterized by a current splitting pair of diodes, each being disposed in parallel between said first current source and each of the circuit junctions between each of said voltage dividing resistors and the corresponding one of said shunting diodes.

5. In an array of semiconductor memory cells, a write and read control circuit comprising:
   a first pair of transistors having their emitter terminals coupled to a first current source, base terminals of said first pair being disposed for receiving a data signal and its differential complement for writing data into said array, and each of said first pair of transistors having collector terminals;
   a second pair of transistors having their collector terminals coupled to a reference potential, the base terminal of a first of said second pair being coupled to the collector terminal of the first of said first pair of transistors and the base terminal of a second of said second pair being coupled to the collector terminal of the second of said first pair, the emitter terminal of the first of said second pair being coupled to a second current source and forming a first output of said circuit, and the emitter terminal of the second of said second pair being coupled to a third current source and forming a second output of said circuit; and,
   a pair of bias voltage means coupled to the base terminals of each of said second pair of transistors.

6. A circuit as in claim 5 further characterized by each of said bias voltage means including a pair of voltage dividing resistors coupled in parallel with a shunting diode.

7. A circuit as in claim 6 further characterized by each of said cells in the array including a pair of diodes integrated substantially the same size as each of said shunting diodes such that both pairs of diodes have substantially the same temperature characteristics.

8. A circuit as in claim 6 further characterized by a first switching transistor being disposed between the emitter terminals of said first pair of transistors and said first current source, and having a base terminal disposed for receiving a write enable signal for said array.

9. A circuit as in claim 8 further characterized by a pair of parallel connected current splitting transistors coupled in series with a second switching transistor having an emitter terminal coupled to said first current source, a base terminal disposed for receiving a differential form of said write enable signal for said array, and a collector terminal coupled to both emitter terminals of said pair of current splitting transistors, and each of the collector terminals of each of said pair of current splitting transistors being coupled to each of the circuit junctions between each of said voltage dividing resistors and the corresponding one of said shunting diodes.

10. A circuit as in claim 8 further characterized by a pair of parallel connected switching transistors having their emitter terminals coupled to said first current source, their base terminals disposed for receiving the differential form of said write enable signal for said array, and each of the collector terminals of said pair of parallel connected switching transistors being coupled to corresponding ones of the circuit junctions between each of said voltage dividing resistors and the corresponding one of said shunting diodes.

* * * * *